United States Patent [19]
Koizumi et al.

[11] Patent Number: 5,323,847
[45] Date of Patent: Jun. 28, 1994

[54] ELECTRONIC APPARATUS AND METHOD OF COOLING THE SAME

[75] Inventors: Shigeru Koizumi; Shizuo Zushi; Mitsuo Komiya, all of Hadano, Japan

[73] Assignee: Hitachi, Ltd., Tokyo, Japan

[21] Appl. No.: 735,890

[22] Filed: Jul. 25, 1991

[30] Foreign Application Priority Data

Aug. 1, 1990 [JP] Japan ............................ 2-204690
Sep. 26, 1990 [JP] Japan ............................ 2-256409

[51] Int. Cl.⁵ .................................... H01L 23/473
[52] U.S. Cl. ............................. 165/104.33; 165/80.3; 165/13; 165/78; 165/70; 165/104.32; 165/71; 361/699
[58] Field of Search ............ 165/80.2, 80.3, 80.4, 165/104.33, 13, 78, 71; 361/699

[56] References Cited

U.S. PATENT DOCUMENTS

| | | | |
|---|---|---|---|
| 3,481,393 | 12/1969 | Chu | 165/104.31 |
| 4,183,400 | 1/1980 | Seifert | 361/385 |
| 4,226,281 | 10/1980 | Chu . | |
| 4,365,666 | 12/1982 | Seifert | 165/104.33 |
| 4,468,717 | 8/1984 | Mathias et al. . | |
| 4,806,956 | 1/1989 | Hamburgen | 165/80.4 |

FOREIGN PATENT DOCUMENTS

| | | |
|---|---|---|
| 0231456 | 8/1987 | European Pat. Off. . |
| 0313473 | 10/1988 | European Pat. Off. . |
| 1806029 | 5/1970 | Fed. Rep. of Germany ...... 361/385 |
| 2618262 | 4/1977 | Fed. Rep. of Germany . |
| 2638702 | 3/1978 | Fed. Rep. of Germany . |
| 2651015 | 5/1978 | Fed. Rep. of Germany . |
| 3003398 | 8/1980 | Fed. Rep. of Germany . |
| 3602489 | 7/1987 | Fed. Rep. of Germany . |
| 3602511 | 7/1987 | Fed. Rep. of Germany . |
| 3721901 | 1/1989 | Fed. Rep. of Germany . |
| 02979 | 4/1988 | PCT Int'l Appl. . |
| 639517 | 11/1983 | Switzerland . |
| 658511 | 11/1986 | Switzerland . |
| 1517650 | 7/1978 | United Kingdom . |
| 1521464 | 8/1978 | United Kingdom . |
| 2213920 | 8/1989 | United Kingdom ............ 165/104.33 |

OTHER PUBLICATIONS

*Packaging and Cooling Technology for the SX System*, Nec Technical Report, vol. 39, No. 1 pp. 36–41, 1986.
*Cooling and Packaging for Facom M-780*, Fujitsu 37, pp. 124–134, Mar. 1986.

*Primary Examiner*—Albert W. Davis, Jr.
*Attorney, Agent, or Firm*—Antonelli, Terry, Stout & Kraus

[57] ABSTRACT

An electronic apparatus comprises an electronic circuit unit having heat-generating electronic parts and cooling jackets fed with a coolant so as to cool the heat-generating electronic parts, and a coolant cooling unit having a heat exchanger for cooling the coolant from the cooling jackets and a pump for pressurizing and feeding the cooled coolant to the cooling jackets. The electronic circuit unit and the coolant cooling unit are housed in the same cabinet, and a partition plate is provided between the electronic circuit unit and coolant cooling unit to partition the two so that in the event of occurrence of liquid leakage, the coolant may be prevented from migrating from the coolant cooling unit to the electronic circuit unit. A coolant drainage drain may be provided at the bottom of a U-shaped portion of a path for circulating the coolant to facilitate drainage of the coolant.

20 Claims, 6 Drawing Sheets

ELECTRONIC APPARATUS AND METHOD OF COOLING THE SAME

BACKGROUND OF THE INVENTION

The present invention relates to an electronic apparatus and, a method of cooling the same, and more particularly, to an electronic apparatus having heat-generating electronic parts which are cooled by using a liquid coolant and a method of cooling the electronic apparatus.

In recent years, as the technique for high-density packaging of integrated circuits boarded on an electronic apparatus has advanced, density of heat generated in the electronic apparatus has been increased. In this type of electronic apparatus, a liquid cooling system as disclosed in, for example, U.S. Pat. Nos. 4,226,281 and 4,800,956 has been employed in place of an air cooling system based on forced convection of air.

A prior art electronic apparatus employing the liquid cooling scheme will be described with reference to FIGS. 12, 13 and 14.

Referring in particular to FIG. 12, the electronic apparatus comprises a plurality of electronic computers 10, each carrying various integrated circuits, and a single cooler 20 which absorbs heat generated in the integrated circuits to cool them.

Provided in the cooler 20 are, as shown in FIG. 14, a primary coolant circulating line through which freon serving as a primary coolant circulates and part of a secondary coolant circulating line through which water serving as a secondary coolant circulates.

The primary coolant circulating line includes a compressor 21 for compressing freon, a condenser 22, a heat exchanger 23 for performing heat exchange between freon and water, and freon pipes 24 for interconnecting together the above components.

The secondary coolant circulating line in the cooler 20 includes a tank 25 for absorbing a change in volume of water, a pump 26 for pressurizing and feeding the water, and water pipes 27 for interconnecting together the above components.

Each electronic computer 10 includes, as shown in FIG. 14, a plurality of electronic circuit modules 11, each having integrated circuits formed on a substrate, cooling jackets 12, fed with water serving as the secondary coolant to cool the electronic circuit modules 11, water pipes 13 for feeding water to and discharging water from the cooling jackets 12, and piping paths 13a.

The water pipes 13 of each electronic computer 10 and water pipes 27 of the cooler 20 are interconnected together by flexible water pipes 19. The flexible water pipes 19 are laid under the floor as shown in FIG. 13 to meet requirements of working efficiency.

Water, warmed up by receiving heat transferred from the electronic circuit modules 11 through the cooling jackets 12, is led to the cooler 20 by the water pipes 13 and flexible pipe 19. Within the cooler 20, the warmed water is cooled by undergoing heat exchange with freon at the heat exchanger 23 in the secondary coolant circulating line, and the cooled water is pressurized by the pump 26 and again led to the cooling jackets 12 of the electronic computer 10.

As compared to the air cooling system, the above described liquid cooling system provides a significantly improved cooling power and is very suitable for cooling large-scale electronic apparatus. However, presently even medium-scale and small-scale electronic apparatus tend toward an increase heat generation density equivalent to the large-scale electronic apparatus and, in some medium-scale and small-scale electronic apparatus, a liquid cooling system similar to that of the large-scale electronic apparatus has been adopted.

However, when a liquid cooling system is employed for the medium-scale and small-scale electronic apparatus which is similar to the large-scale electronic apparatus, wherein the electronic computer and the cooler which are separately individual units, the following problems arise:

The medium-scale or small-scale electronic apparatus is often installed in an ordinary office room and reduction of installation space is one of its important performance factors. However, the arrangement in which the electronic computers and the cooler are disposed separately adversely affects realization of a realization of the installation space reduction and requires a sophisticated layout at the installation site.

Piping has to be laid between the electronic computers and the cooler and consequently installation is time-consuming. Especially when the installation site is in an ordinary office, it is preferable that installation be finished within as short a period of time as possible; however, it takes a long time to rearrange other office machines and, in any case, the office may be soiled.

Because of resistance between the electronic computers and the cooler, pumping power of a pump in the cooler has to be increased to make up for the piping resistance and accordingly the pump is increased in size and running cost is raised.

The electronic apparatus with the liquid cooling system faces a further problem in that, when the electronic apparatus of a liquid cooling system in non-operational for a long period of time, the coolant deteriorates and there is an increase in corrosion of the jackets and pipes ultimately resulting in requiring a draining of the coolant.

However, in the prior art electronic apparatus, a method for draining the coolant is not, in particular, considered and, even if a coolant drainage is effected in the construction shown in FIG. 14, the coolant in the flexible pipes 19 laid under the floor and in the piping paths 13a cannot be drained.

With a view of preventing this problem, a method has been proposed in which highly pressurized air is fed so as to remove the coolant in the cooling jackets; however, disadvantages to this proposed method resides in the fact that a compressor is required, thereby providing yet an additional component which requires maintenance and drainage becomes complicated.

SUMMARY OF THE INVENTION

The present invention seeks to avoid the aforementioned problems resulting from the separate disposition of the electronic computers cooler and by providing an electronic apparatus and a method of cooling the electronic apparatus which can reduce the installation space, the installation time and the size of pump.

With regard to drainage of coolant, according to the invention an electronic apparatus is provided having a construction capable of easily draining the coolant easily.

According to the present invention, an electronic apparatus is provided which comprises an electronic circuit unit including heat-generating electronic parts, and cooling jackets fed with a coolant so as to cool heat generating electronic parts. A coolant cooling unit is provided which includes coolant cooling means for cooling the coolant from the cooling jacket, and coolant feed means for feeding the cooled coolant to the cooling jacket. The electronic circuit unit and the coolant cooling unit are housed in the same cabinet, and a partition plate is positioned so as to separate or partition the electronic circuit unit from the coolant cooling unit.

In accordance with the method of the present invention for cooling an electronic apparatus having heat-generating electronic parts, the cooling jackets are mounted to the heat-generating electronic parts of the electronic apparatus, and a coolant cooling unit for cooling a coolant for the electronic apparatus and a cooling feed unit for feeding the cooled coolant to the cooling jackets are mounted in the same cabinet. A partition plate is provided between electronic parts and the coolant cooling unit and the coolant feed unit, and the coolant feed unit feeds the coolant cooled by the coolant cooling unit to the cooling jackets and causes the cooling jackets to cool the heat-generating electronic parts.

According to the invention, since the electronic circuit unit and the coolant cooling unit are mounted in the same cabinet, it is possible to realize a reduction in the installation space and facilitate the layout in the installation room.

For installation working of the electronic apparatus, piping can be dispensed with and therefore the installation working time can be reduced and spoiling of the installation place can be prevented.

Further, since coolant pipes laid between the electronic circuit unit and coolant cooling unit are short and of a fixed length, pumping power can be reduced by a decrease in piping resistance, thus reducing the size of pump and the operating cost.

With the electronic circuit unit and coolant cooling unit mounted in the same cabinet, accidental leakage of the coolant would adversely affect the electronic circuit unit. In the present invention, however, due to the provision of the partition plate between the electronic circuit unit and coolant cooling unit, the coolant can be prevented from migrating from the coolant cooling unit to the electronic circuit unit, thus minimizing the influence upon the electronic circuit unit.

In accordance with further features of the present invention, an electronic apparatus is provided which includes heat-generating electronic parts, and a circulating path of a coolant for cooling the heat-generating electronic parts. The circulating path includes cooling jackets for cooling the heat-generating electronic parts, and coolant cooling means for cooling the coolant from the cooling jackets. Coolant feed means are provided for feeding the cooled coolant to the cooling jackets, and a piping path passes the coolant through the cooling jacket, coolant cooling means and coolant feed means, the heat-generating electronic parts and the circulating path are housed in the same cabinet, and a coolant drainage drain is provided at the bottom of a U-shaped portion of the circulating path.

In accordance with the invention, an electronic apparatus is provided wherein the cooling jackets for transferring heat generated in heat-generating electronic parts to a liquid coolant and the coolant cooling unit including a pump, a heat exchanger and a tank which serves as means for cooling the coolant and feeding the cooled coolant to the cooling jackets are housed in the same cabinet. The tank is packaged at a portion of a coolant piping system which is at the highest level, and other portions of the piping system are free from liquid stagnation. In accordance with another embodiment of the invention, there is provided an electronic apparatus wherein the cooling jackets, pump, heat exchanger and tank are housed in the same cabinet, at least the tank being mounted higher than the heat exchanger, and other portions of a piping system than the heat exchanger are free from liquid stagnation.

According to the electronic apparatus constructed in accordance with the present invention, since the electronic parts and the pump, cooling jackets, heat exchanger and tank constituting a circulating path of the coolant for cooling the electronic parts are housed in the same cabinet, the coolant paths laid under the floor as in the prior art are not required to facilitate drainage of the coolant.

Further, the coolant is all drained through the coolant drainage drain provided at the bottom of a U-shaped portion formed in the circulating path and therefore compressed air as in the prior art need not be used.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Preferred embodiments of the invention will now be described with reference to FIGS. 1 to 11B.

Referring in particular to FIGS. 1 to 4, a first embodiment of an electronic apparatus will be described.

Figure 1:
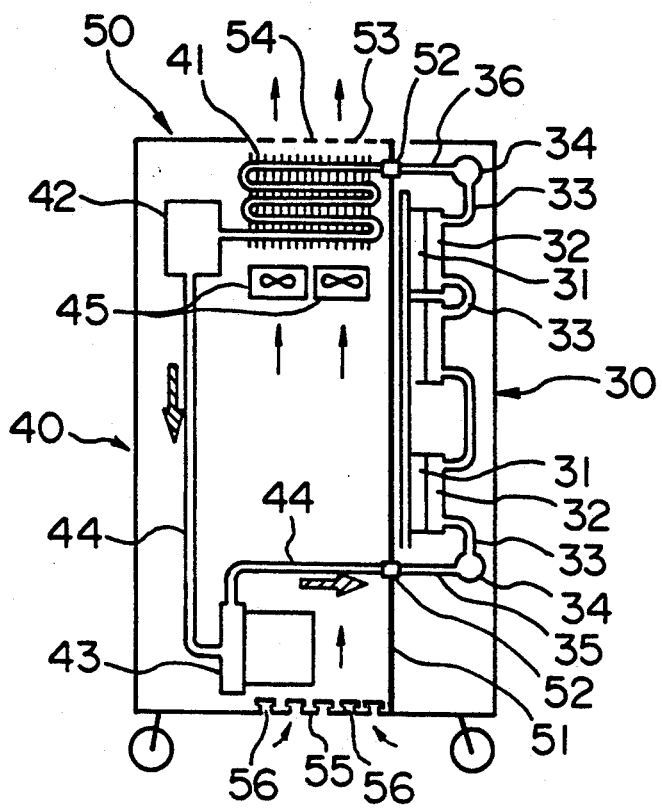
FIG. 1 is a schematic view of an electronic apparatus.
Figure 2:
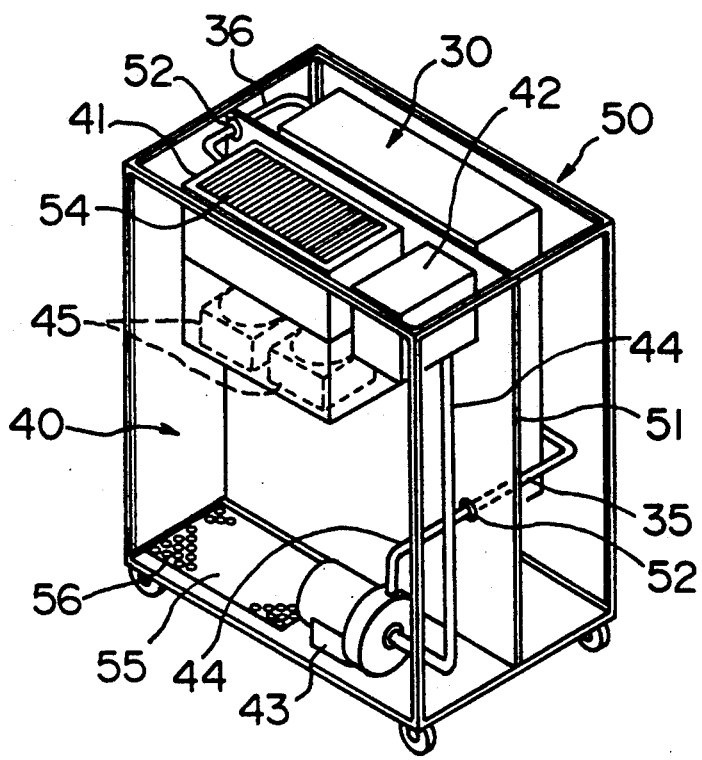
FIG. 2 is a perspective view of the electronic apparatus of FIG. 1.

As shown in FIGS. 1 and 2, the electronic apparatus comprises an electronic circuit unit 30 and a coolant cooling unit 40.

The electronic circuit unit 30 includes a plurality of electronic circuit modules 31, each having a substrate on which a plurality of integrated circuits and the like representing heat-generating electronic parts are formed and cooling jackets 32 intimately mounted to the surfaces of the electronic circuit modules 31 in order to transfer heat generated in the electronic circuit modules 31 to water serving as a coolant. The cooling jackets 32 are interconnected by flexible coolant pipes 33, with a flexible coolant pipe 33 at one end being connected to a coolant inlet pipe 35 through a header pipe 34 and another flexible coolant pipe 33 at the other end being connected to a coolant outlet pipe 36 through a second header pipe 34.

The coolant cooling unit 40 includes a heat exchanger 41 which performs a heat exchange between water warmed up by the cooling jackets 32 and air to cool the warmed water, a tank 42 for absorbing a change in volume of water due to thermal expansion and contraction, a coolant feed pump 43 for feeding cooled water to the cooling jacket 32, coolant pipes 44 for mutually interconnecting the above components, and blast fans 45 for blowing air toward the heat exchanger 41.

The electronic circuit unit 30 and coolant cooling unit 40 are both housed in a single cabinet 50 in such a manner that the electronic circuit unit 30 is disposed on the front side of the cabinet 50 and the coolant cooling unit 40 is disposed on the back side of the cabinet 50.

Figure 4:
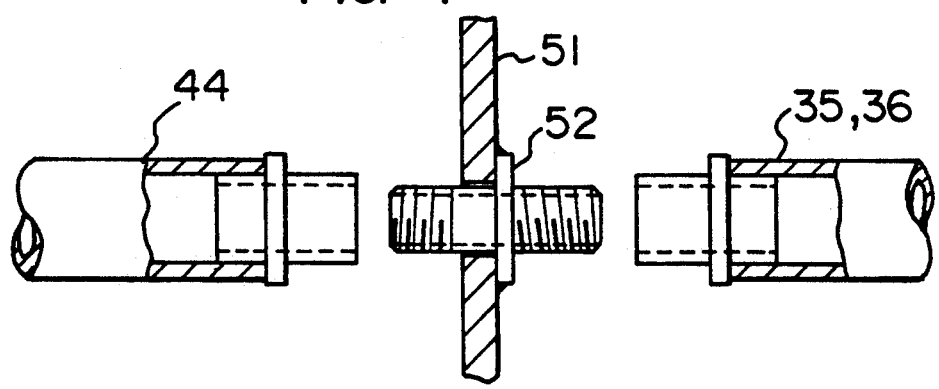
FIG. 4 is a partial sectional view of a joint between a coolant pipe of the electronic circuit unit and coolant pipe of the coolant cooling unit.

A partition plate 51 is provided between the electronic circuit unit 30 and coolant cooling unit 40. Nipples 52, 52 are fixedly mounted by fusing to the partition plate 51, as shown in FIGS. 1 and 4, to connect the coolant pipes 35, 36 of electronic circuit unit 30 and the coolant pipes 44 of coolant cooling unit 40.

The heat exchanger 41, adapted to perform heat exchange between water serving as the coolant and air, is constructed of a tube with fins and it is disposed at the uppermost portion or the highest level inside the cabinet 50. The blast fans 45 are disposed directly beneath the heat exchanger 41. Air is blown from below toward the heat exchanger 41 to facilitate air warmed up by heat exchange, and reduced in specific weight to escape in an upward direction.

Figure 3:
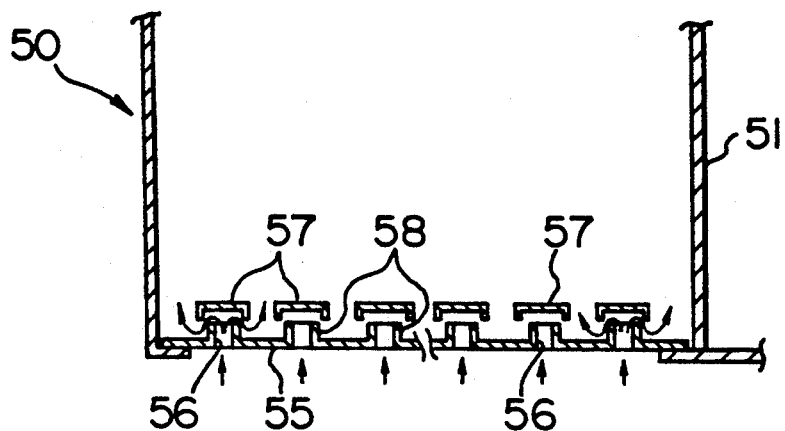
FIG. 3 is a partial cross sectional view of a bottom of a cabinet of the apparatus of FIG. 1.

Formed in a cabinet top 53 lying above the heat exchanger 41 are a plurality of exhaust holes 54 through which air warmed up by heat exchange is exhausted. Formed in a cabinet bottom 55 lying below the blast fans 45 are a plurality of small intake perforations 56 through which the open air is admitted into the cabinet 50. Each of the intake perforations is surrounded by a discharge prevention dam 58 as shown in FIG. 3 to prevent water, accidentally leaking from the coolant pipes 44 and the like, from migrating to the outside of the cabinet 50. Directly above each intake perforation 56 is mounted a plate 57 which is effective to prevent coolant droplets dropping from above from going out of the cabinet directly through the intake perforation 56.

Heat generated in the electronic circuit module 31 is transferred to water of coolant by the cooling jacket 32. Water warmed up by heat transferred thereto is once collected to the header pipe 34 through the flexible coolant pipes 33 and then led to the heat exchanger 41 through the coolant outlet pipe 36, nipple 52 and coolant pipe 44 of coolant cooling unit 40. At the heat exchanger, the warmed water is subjected to heat exchange with air suctioned into the cabinet 50 by the blast fans 45 so as to be cooled. Air warmed by the heat exchange is exhausted through the exhaust holes 54 formed in the cabinet top 53. The cooled coolant is sent to the tank 42 where its pressure is reduced to atmospheric pressure, and is then pressurized by the coolant feed pump 43. The pressurized coolant is again sent to the cooling jackets 32 of the electronic circuit unit 30.

Since in the electronic apparatus of the present embodiment the electronic circuit unit 30 and coolant cooling unit 40 are both housed in the same cabinet 50, the space for installation can be reduced. Further, the coolant pipes between the electronic circuit unit 30 and coolant cooling unit 40 can be mounted in the course of production, thus reducing the installation. Furthermore, the coolant pipes between the electronic circuit unit 30 and coolant cooling unit 40 are short having a fixed length and therefore pumping power can be reduced in proportion to a reduction in piping resistance to reduce the size of pump and the running cost.

Conceivably, the incorporation of both of the electronic circuit unit 30 and coolant cooling unit 40 into the same cabinet 50 would raise such inconvenience that water serving as coolant accidentally migrates to the electronic circuit unit 30 but due to the partition plate 51 provided between the electronic circuit unit 30 and coolant cooling unit 40, water leaking from, for example, the coolant pipe 44 of the coolant cooling unit 40 can completely prevented from migrating into the electronic circuit unit 30.

Prevention of leakage of water to the electronic circuit unit 30 has to be as perfect as possible and it is preferable to avoid interconnecting the pipes inside the electronic circuit unit 30 together by screw-coupling. Therefore, in the present embodiment, screw-coupling is applied to only connections of the coolant pipes 35 and 36 to the nipples 52. The application of screw-coupling to the connection of the coolant pipes 35 and 36 of electronic circuit unit 30 to the coolant pipes 44 of coolant cooling unit 40 through the nipples 52 is due to the fact that the production procedure and inspection process for the electronic circuit unit 30 differs from that for the coolant cooling unit 40 and therefore these units need to be readily separable from each other.

The amount of heat generated in medium-scale or small-scale electronic apparatus is in general small and so, in the present embodiment, coolant cooling means is constructed of the heat exchanger 41 and blast fans 45 to reduce the size of the electronic apparatus. If the heat generation amount is large, a condenser and an evaporator using freon as a coolant may be additionally provided though the size reduction is impaired.

Figure 5:
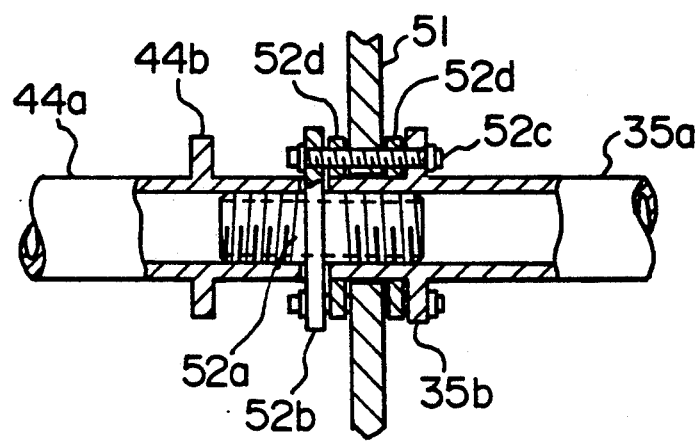
FIG. 5 is partial cross sectional view of a modification of a joint between coolant pipes of the electronic circuit and coolant cooling units in accordance with a first embodiment of the present invention.

In the embodiment of FIG. 5, the joint of a coolant pipe 35a of the electronic circuit unit 30 to a nipple 52a is offset, relative to the partition plate 51, toward the coolant cooling unit 40.

The nipple 52 is provided, at its substantially axially central portion, with a flange 52b formed with a plurality of holes through which bolts for fixing the nipple 52a to the partition plate 51 may be inserted. The coolant pipe 35a of the electronic circuit unit 30 is provided, near its end, with a flange 35b and similarly a coolant pipe 44a of the coolant cooling unit 40 is provided, near its end, a flange 44b. The flange 35b is also formed with a plurality of holes for insertion of bolts.

In order to connect the coolant pipe 35a of electronic circuit unit 30 and the coolant pipe 44a of coolant cooling unit 40, the flange 52b of nipple 52a is positioned on the side of the coolant cooling unit 40, the coolant pipe 35a of electronic circuit 30 and the coolant pipe 44a of coolant cooling unit 40 are brought into mesh engagement with the nipple 52a under this condition, and the flange 52b of nipple 52a and the flange 35b of coolant pipe 35a of the electronic circuit unit 30 are connected together through the partition plate 51 by means of bolts 52c. A packing 52d is interposed between each of the flanges 35b and 52b and the partition plate 51' is. interposed a packing 52d.

With this construction, the electronic circuit unit 30 can be devoid of screw coupling to minimize factors of water leakage and facilitate separation between the electronic circuit unit 30 and coolant cooling unit 40.

Figure 6:
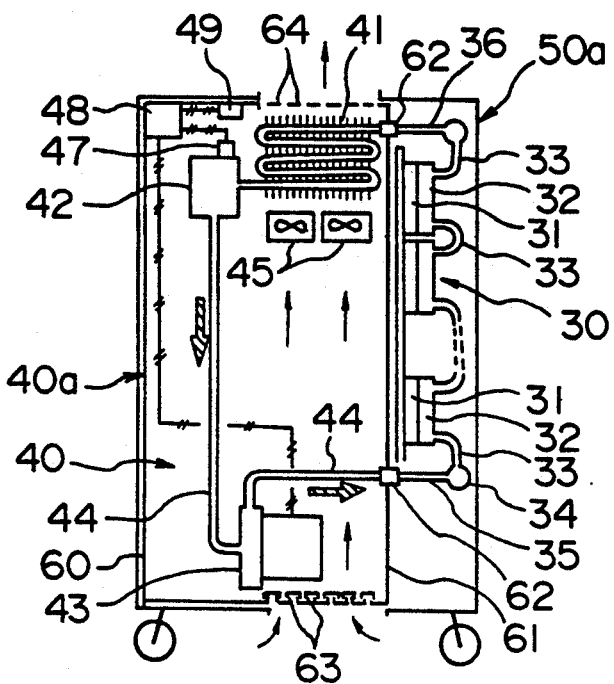
FIG. 6 is a schematic view of another construction of an electronic apparatus.
Figure 7:
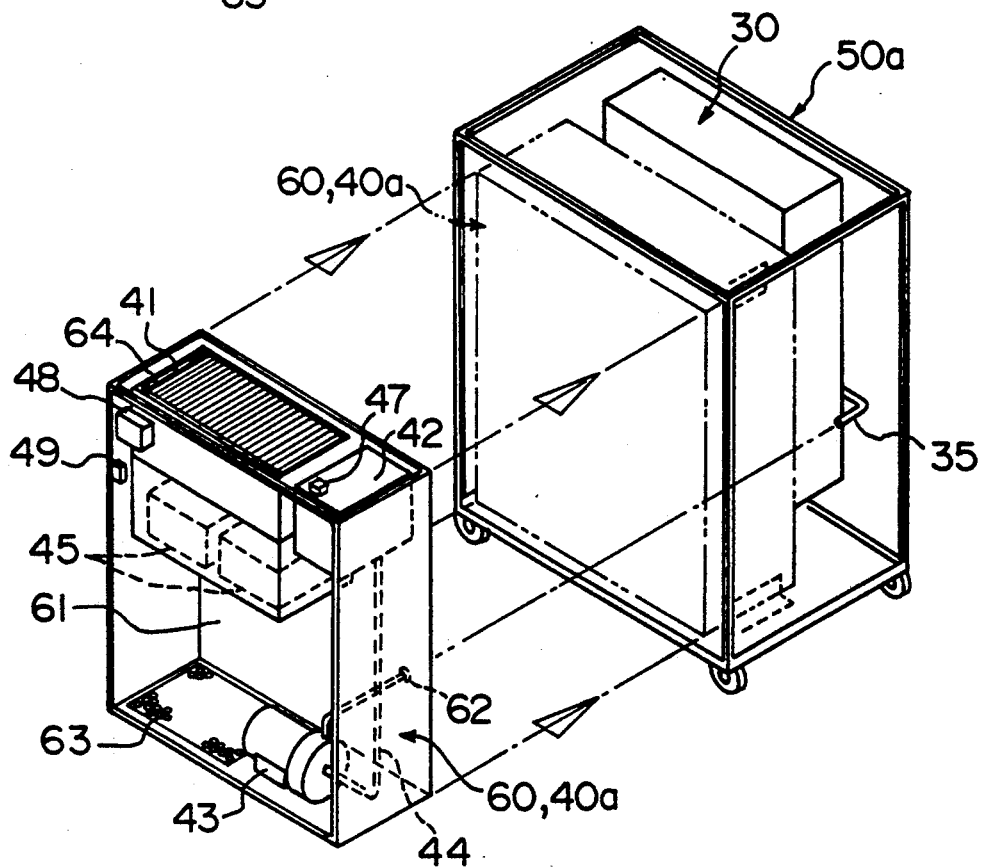
FIG. 7 is a perspective view of the apparatus of FIG. 6.

In the electronic apparatus according to FIGS. 6 and 7, the same coolant cooling unit 40 as that of the first embodiment is mounted in a frame 60 to provide a unitary structure and as in the case of the first embodiment, the unitary structure is housed, along with the electronic circuit unit 30, in a cabinet 50a. Essentially, the present embodiment has the same construction as that of the first embodiment with the only exception that the coolant cooling unit has the unitary structure, and therefore the same elements as those of the first embodiment are designated by the same reference characters and will not be described herein.

The frame 60 has a partition plate 61 which confronts the electronic circuit unit 30 and which is provided with nipples 62 adapted to connect coolant pipes 35, 36 of the electronic circuit unit 30 and coolant pipes 44 of the coolant cooling unit 40. Formed in the bottom of the frame 60 are intake perforations 63 through which the open air is suctioned and formed in the top of the frame 60 are exhaust holes 64 through which air warmed up by a heat exchanger 41 is exhausted.

Disposed inside the frame 60 are constituents of the coolant cooling unit 40 which are the heat exchanger 41, a tank 42, a coolant feed pump 43, the coolant pipes 44 for interconnecting the above components together, and blast fans 45. Additionally, a coolant amount detector 47 for detecting the amount of coolant in the tank 42, a controller 48 responsive to a detected coolant amount to produce a coolant leakage detection signal and a pump stop signal, and an alarm 49 operable to raise an alarm when receiving the coolant leakage detection signal are provided. The coolant amount detector 47 may be constructed of a known float and potentiometer adapted to support the float and may operate to supervise the liquid level in the tank 42.

The coolant amount detector 47 cooperates with the controller 48 to detect the coolant decreasing rate and the leakage of coolant and the controller 48 cooperates with the coolant feed pump 43 to stop feeding of the coolant.

The previously-described frame 60 and various components mounted in the frame 60 constitute a cooling unit 40a.

The coolant decreasing rate detecting operation and the coolant leakage detecting operation will now be described in more detail.

Since the tank 42 in the embodiment of FIGS. 6 and 7 is an atmospheric exposure type tank (non-airtight type), the coolant is vaporized, though little by little, during normal cooling operation and the liquid level of coolant in the tank lowers gradually. On the other hand, the coolant amount detector 47 supervises the liquid level by using the float positioned in the tank, so that when the liquid level falls below a level at which replenishment of the coolant is needed, a liquid replenishment alarm indication not shown is lighted on. As the coolant decreases spontaneously, the liquid level lowers to the level at which the liquid replenishment is needed but in that case it is not necessary to take urgent action and the electronic apparatus keeps operating.

In contrast therewith, the occurrence of leakage of the coolant gives rise to thermal breakage of the electronic circuit unit or migration of the coolant to the floor on which the electronic apparatus is installed and it must be strictly discriminated from the aforementioned spontaneous decrease of coolant to urge necessary action to be taken. Thus, in the present embodiment, the decreasing rate of the coolant in the tank 42 is always supervised and by determining its value in excess of a specified value (spontaneous decreasing rate expected to occur), the leakage of coolant can be detected. Further, according to the embodiment of FIGS. 6 and 7, when the leakage of coolant is detected, it is decided in accordance with the magnitude of the coolant decreasing rate as to whether the leakage of coolant is dangerous to the electronic apparatus, that is, as to whether safety lock is necessary and then different protective operations are carried out depending on necessity and non-necessity of safety lock.

Figure 8:
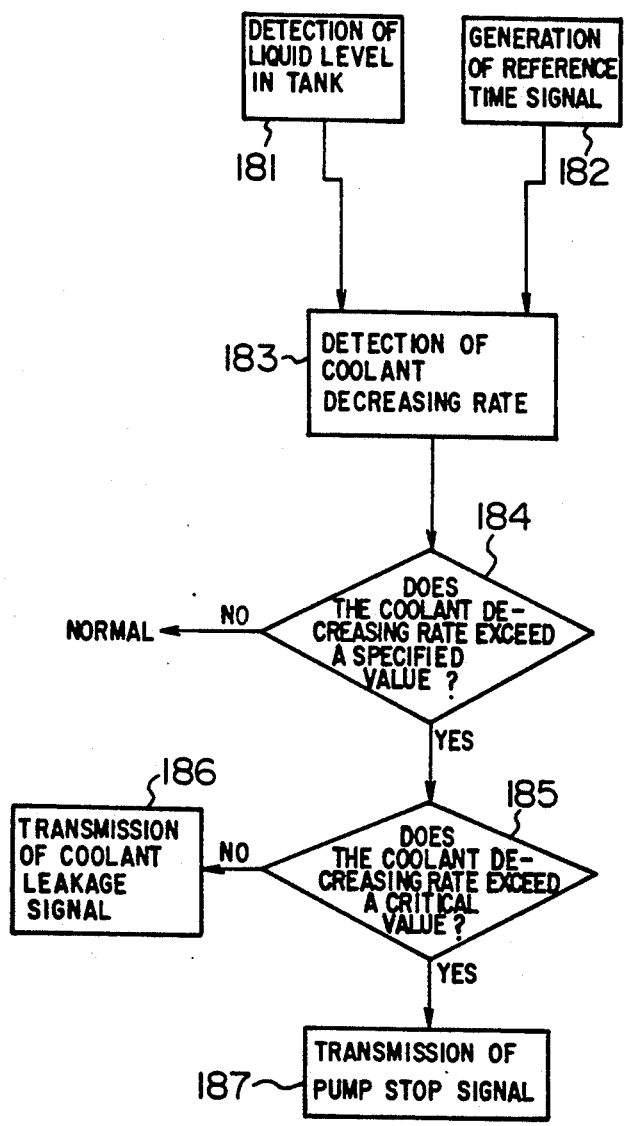
FIG. 8 is a flow chart for explaining the operation of coolant leakage detection and coolant decreasing rate detection.

The operation upon the leakage of coolant will now be described with reference to a flow chart of FIG. 8.

The potentiometer for detecting the position of the float provided in the tank 42 always detects the liquid level and informs the controller 48 of a detected value of the liquid level (step 181). The controller 48 on the other hand incorporates a reference signal generator which generates a reference signal at a predetermined period (step 182).

The controller 48 calculates a decreasing rate of the coolant on the basis of the detected value of the liquid level and the reference signal (step 183).

The controller 48 is present with the spontaneous decreasing rate (specified value) expected to occur on account of vaporization of the coolant and a decreasing rate (critical value) at which safety lock for the cooling unit is needed. In the event that the coolant leaks, the amount of coolant in the coolant circulating line decreases abruptly, decreasing the coolant amount in the tank 42 and lowering the liquid level in the tank. The controller 48 calculates a decreasing rate of the coolant in step 183 in accordance with a decrease in the liquid level. The controller first compares the calculated rate with the specified value (step 184) and if the decreasing rate of the coolant exceeds the specified value, it then compares the decreasing rate with the critical value (step 185). If the critical value is not exceeded, the controller merely transmits a coolant leakage detecting signal to the alarm 49 (step 186) but if the critical value is exceeded, it transmits the coolant leakage detecting signal to the alarm 49 and at the same time it recognizes the necessity of safety lock, delivering a pump stop signal to the cooling pump 43 (step 187).

Receiving the coolant leakage detecting signal, the alarm 49 is activated to inform the operator of the leakage of the coolant. The operator informed by the alarm can take necessary action such as stopping the operation of the electronic circuit unit or inspecting the coolant.

If the coolant leakage amount is very large exceeding the critical value, the controller 48 issues the pump stop signal as described previously to stop the coolant feed pump 43. As a result, the coolant is prevented from circulating through the coolant circulating line and the influence of the leakage can be suppressed to a minimum.

In the present embodiment, the same effects as in the first embodiment can be attained and besides the coolant cooling unit 40 in the form of the unitary structure can be mounted to and dismounted from the cabinet 50a very easily.

Therefore, the electronic apparatus can be manufactured by producing the electronic circuit unit 30 and the coolant cooling unit 40 in completely separate production lines and building the cooling unit 40a in the cabinet eventually, thereby simplifying the production process and the inspection process during production. Further, by virtue of very easy separation of the coolant cooling unit 40 from the electronic circuit unit 30, maintenance/inspection and repairs can be done easily and very quickly.

In addition, accidental leakage of coolant can be dealt with by raising an alarm and stopping the coolant feed pump and so the electronic apparatus of the present embodiment can be more improved in reliability than the electronic apparatus of the first embodiment.

In the present embodiment, for the coolant leakage amount being very large, the coolant feed pump 43 is stopped but in an alternative, an electromagnetic valve inserted in the coolant circulating line may be closed under the command of the controller 48.

While in the present embodiment the coolant leakage is detected by detecting the amount of coolant in the tank 42, direct detection of the coolant leakage may alternatively be effected by using a leakage detector provided at the bottom of the frame.

For example, in case where the electronic circuit unit 30 constitutes an information processing apparatus, a signal representative of detected coolant leakage may be applied to a CPU comprised in the apparatus and the CPU in receipt of this signal may save a processing presently put in execution in a recording medium.

Figure 9:
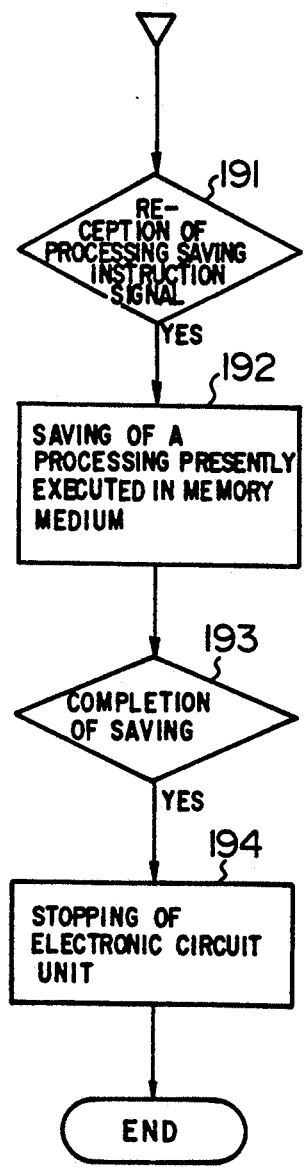
FIG. 9 is a flow chart for explaining the operation of saving a processing in execution by an information processing unit in a memory medium.

The saving operation will be described in more detail with reference to a flow chart of FIG. 9.

The controller 48 of the cooling unit 40a issues a pump stop signal to the pump 43 and concurrently therewith transmits to a CPU (not shown) a signal for instructing the CPU to save a processing when the coolant decreasing rate exceeds the critical value in step 184 described in connection with FIG. 8. When the CPU receives this signal (step 191), it saves the processing presently put in execution in a memory medium such as for example a magnetic tape (step 192), confirms the completion of the saving (step 193) and thereafter stops the electronic circuit unit (step 194).

According to this embodiment, even when the electronic apparatus is stopped due the leakage of the coolant, the results of operations which have already been executed will never be lost.

Obviously, the coolant amount detector 47, controller 48 and alarm 49 which are provided in the present embodiment may be applied to the first embodiment.

In the foregoing embodiments, the provision of means for detecting coolant leakage makes it possible to urge the operator to take quick action in response to accidental leakage of the coolant. In addition, by virtue of the provision of means for stopping coolant feed, feeding of the coolant to the electronic circuit unit can be stopped in the event that the leakage of the coolant is heavy, thereby minimizing the influence of the leakage of the coolant upon the electronic circuit unit.

The provision of both the electronic circuit unit and coolant cooling unit in the same cabinet will however raise a problem that the difference in production process, inspection method and life between the electronic circuit unit and coolant cooling unit makes the production process and repair procedure complicated.

To solve this problem, as in the second embodiment, the coolant cooling unit is provided with the frame in which various components of the coolant cooling unit are integrally mounted to provide the unitary structure. The coolant cooling unit taking the form of the unitary structure makes it possible to facilitate separation of the coolant cooling unit from the electronic circuit unit and permit and facilitate separate production, inspection and repairs of these units. Especially, in the event of liquid leakage, a new cooling unit can be brought to a place where an electronic apparatus has been installed and used and a unitary structure of a defective unit suffering from liquid leakage can be exchanged with that of the new unit, thus expiditing repair.

Referring now to FIGS. 10A, 10B, 11A and 11B, third and fourth embodiments of the electronic apparatus will be described. These embodiments are effective to facilitate drainage of coolant.

Figure 10A:
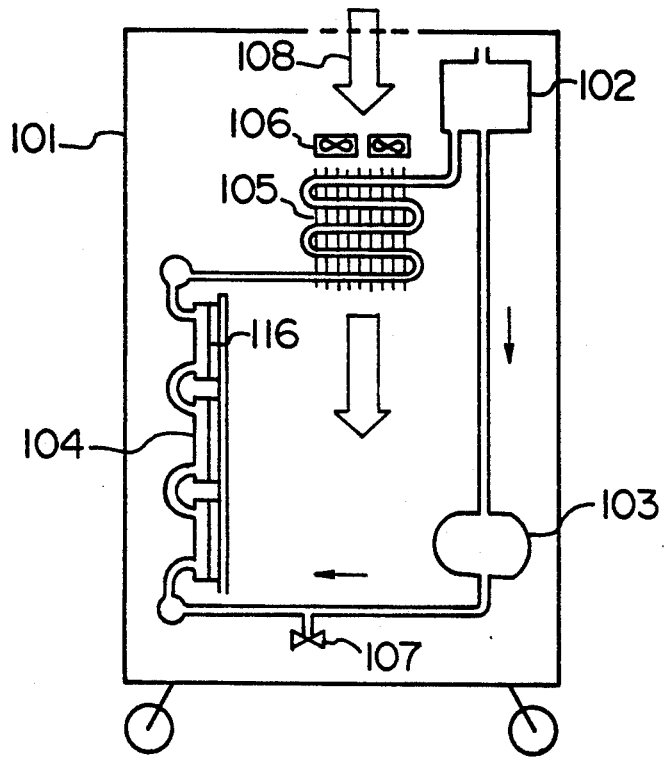
FIG. 10A is a schematic view of a third embodiment of an electronic apparatus.

As shown in FIG. 10A, the electronic apparatus according to the third embodiment comprises an electronic circuit unit and a coolant cooling unit for cooling a coolant which are both housed in a single cabinet 101.

The electronic circuit unit includes a plurality of electronic circuit modules 116 each having integrated circuits packaged on a substrate, and a cooling jacket 104 intimately mounted to the surface of each module so as to transfer heat generated in each electronic circuit module to a coolant.

The coolant fed from the coolant cooling unit is passed from a lower cooling jacket to an upper jacket sequentially and the coolant, now warmed up by receiving heat, is sent to the coolant cooling unit.

Piping within the electronic circuit unit is so designed as to eliminate a U-shaped portion where liquid tends to stagnate.

The coolant cooling unit includes a pump 103 for pressurizing and feeding liquid of the coolant, a heat exchanger 105 and blowers 106 for cooling the warmed coolant by causing it to undergo heat exchange with air admitted through the top of the cabinet, an atmospheric exposure type tank 102 for absorbing a change in volume of the coolant due to thermal expansion and contraction, and piping parts for interconnecting together the above components. In the third embodiment, cooling air 108 flows from above to below.

The components are interconnected together by the piping parts in sequence of the pump 103, electronic circuit unit 104, heat exchanger 105 and tank 102, as shown in FIG. 10A, to form a circulating path returning to the pump 103.

The tank 102 is located at the highest level and other components and piping parts are so located as to prevent liquid stagnation.

A drain 107 for drainage of the coolant is disposed at the lowest part or bottom of a U-shaped portion of the piping system.

With the above construction, since the atmospheric exposure type tank 102 is disposed at the highest level, the coolant in the piping system can all be drained, through the drain 107 opened upon drainage of the coolant, by atmospheric pressure applied to the tank 102.

Figure 10B:
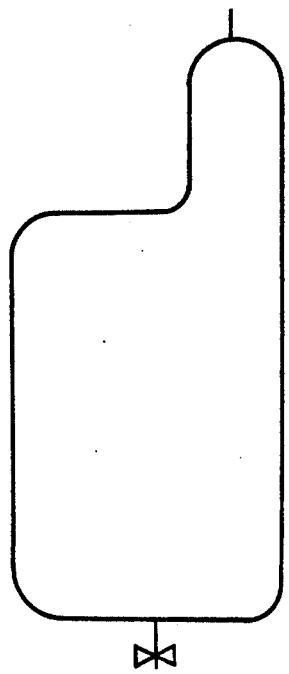
FIG. 10B is a schematic view of a coolant path.

FIG. 10B shows a coolant path in the electronic apparatus according to the third embodiment. As shown, the tank (also filling the role of an air valve for admitting air) is disposed at the top of an inverted U-shaped portion formed in the circulating path and the coolant drainage drain is disposed at the bottom of a U-shaped portion formed in the circulating path. In the present embodiment, thanks to the provision of the tank at the highest level, there is no need of providing any additional air valve.

The fourth embodiment of the invention will now be described. Components like those of the third embodiment are designated by like reference numerals and description thereof will be omitted.

Figure 11A:
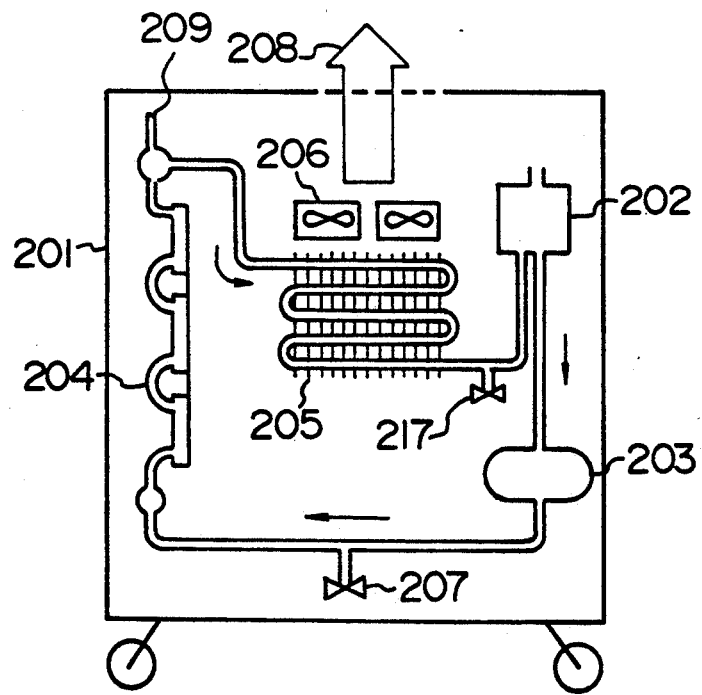
FIG. 11A is a schematic view of a fourth embodiment of an electronic apparatus and associated cooling structure.

As shown in FIG. 11A, in the electronic apparatus according to the fourth embodiment, cooling air 208 is forced to flow from below to above and a tank 202 is disposed higher than the heat exchanger but lower than the electronic circuit unit.

In the fourth embodiment having the construction as above, an air valve 209 is located at the highest level in the piping system and a second drain 217 is located below a heat exchanger 205. Denoted by 201 is a cabinet.

Drainage of the coolant is carried out in two steps.

In the first step, the air valve 209 at the highest level is opened so that coolant in electronic circuit unit 204, tank 202 and pump 203 may be drained through a drain 207 at the lowest level.

In the second step, the second drain 217 is opened so that coolant in the heat exchanger 205 may be drained.

Figure 11B:
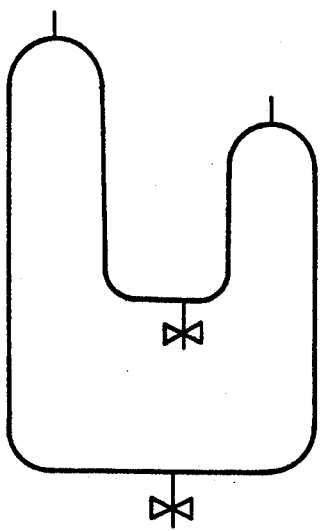
FIG. 11B is a schematic view of a coolant path of the construction of FIG. 11A.
Figure 12:
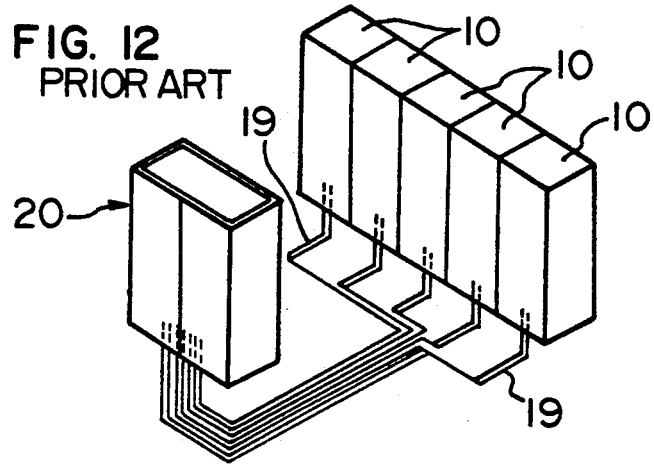
FIG. 12 is a perspective view of a construction of a conventional electronic apparatus.
Figure 13:
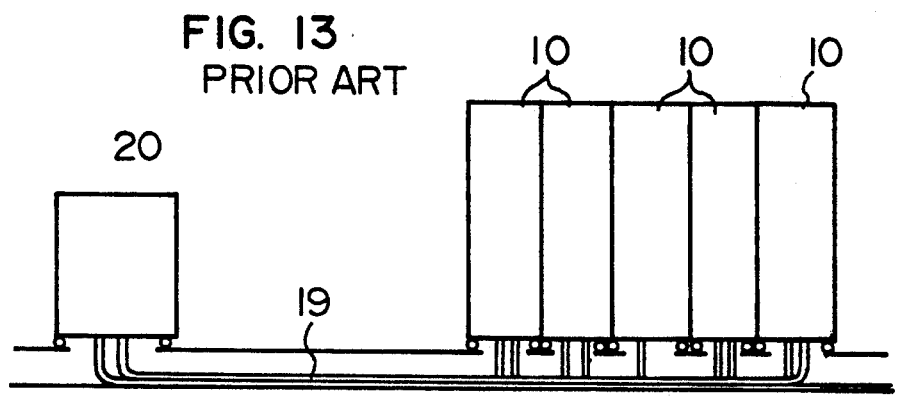
FIG. 13 is a schematic side view of the electronic apparatus of FIG. 12.
Figure 14:
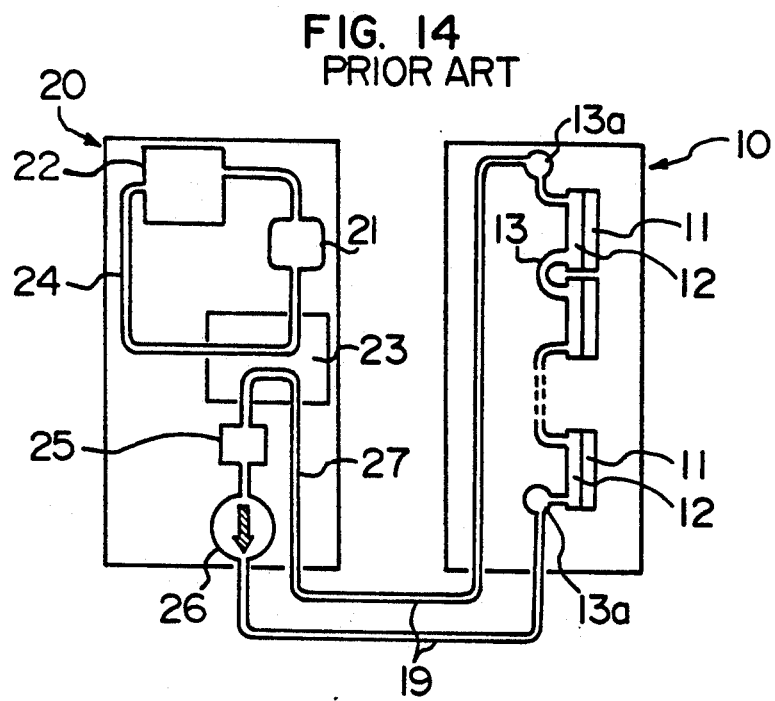
FIG. 14 is a schematic view of the construction of a conventional electronic apparatus.

FIG. 11B shows a coolant path in the electronic apparatus according to the fourth embodiment. As shown, the tanks (also filling the role of air valves) are respectively disposed at apical of two inverted U-shaped portions formed in the circulating path and the coolant drainage drains are respectively disposed at the bottoms of two U-shaped portions formed in the circulating path.

As described above, in accordance with the present embodiment, the coolant in the piping system can be drained readily without resort to the application of external pressure and equipment for maintenance of the apparatus can be simplified.

In the third and fourth embodiments, the atmospheric exposure type tank is used but the invention may be applied to an electronic apparatus using a closed type tank by employing a separate air valve or air valves. In addition to the system wherein the coolant is cooled with air, the invention may suitably be applied to a system in which coolant is cooled with, for example, freon and the electronic apparatus is cooled using the cooled coolant.

In the foregoing, various constructions of the electronic apparatus have been described by referring to various embodiments but the constructions of these embodiments my suitably be used in combination. For example, the electronic apparatus having the partition plate detailed in connection with the first embodiment can be provided with the coolant drainage drain of the third embodiment.

While particular embodiments of the present invention have been shown and described, it will be obvious to those skilled in the art that various changes and modifications may be made without departing from the present invention in its broader aspects.

We claim:

1. An electronic apparatus comprising:
   an electronic circuit unit including heat-generating electronic parts, and cooling jackets fed with a coolant from a coolant pipe so at to cool said heat-generating electronic parts;
   a coolant cooling unit including a coolant tube with fins through which said coolant passes for cooling the coolant from said cooling jackets, a cooling fan for blowing air to said coolant tube with fins, a tank disposed in a coolant flow path for absorbing a change in volume of said coolant due to thermal expansion and contraction, and a pump for feeding the cooled coolant to said cooling jackets by way of a coolant pipe of said cooling unit;
   a partition plate;
   said electronic circuit unit and said coolant cooling unit being housed side by side in the same cabinet on respective sides of said partition plate which partitions the electronic circuit unit and the coolant cooling unit, said partition plate extending from the bottom to the top of said cabinet, and said cabinet having casters movable on a floor, whereby the electronic circuit unit is not located beneath the coolant tube with fins and the tank of the coolant cooling unit so that coolant leaked and dropped from the coolant tube with fins and/or the tank does not contaminate the electronic circuit unit, said cabinet having apertures at least on the bottom of said cabinet, for ingress and egress of air from a space between the bottom of said cabinet and a floor surface to said coolant cooling unit.

2. An electronic apparatus according to claim 1 wherein said coolant cooling unit is mounted in a single frame or base having said partition plate on the side thereof of said electronic circuit unit so that said cooling unit has the form of a unitary structure.

3. An electronic apparatus according to claim 2 wherein said cooling unit further includes:
   leakage detecting means for detecting leakage of the coolant;
   coolant leakage alarm means for raising an alarm when leakage of the coolant is detected; and
   coolant feed stopping means for stopping said coolant feed means when leakage of the coolant is detected.

4. An electronic apparatus according to claim 3 wherein said coolant leakage detecting means has coolant decreasing rate detecting means for detecting a decreasing rate of the coolant to be fed to said objects to be cooled so that leakage of the coolant may be determined when the decreasing rate of the coolant exceeds a predetermined value.

5. An electronic apparatus according to claim 2 further comprising a piping path for passing the coolant through said cooling jackets, coolant tube with fins and pump, and a coolant drainage drain provided at the bottom of a U-shaped portion of said piping path.

6. An electronic apparatus according to claim 1 wherein ends of coolant pipes from said electronic circuit unit are offset, relative to said partition plate, toward said coolant cooling unit and connected at the offset position to coolant pipes from said coolant cooling unit.

7. An electronic apparatus according to claim 1 further comprising coolant leakage detecting means for detecting leakage of the coolant; and
   coolant leakage alarm means for raising an alarm when leakage of the coolant is detected.

8. An electronic apparatus according to claim 7 wherein processing ending means is provided which is operable to end, in a suitable fashion, a processing or operation presently put in execution by said electronic circuit unit when leakage of the coolant is detected by said coolant leakage detecting means.

9. An electronic apparatus according to claim 7 wherein coolant feed stopping means is provided which is operable to stop feeding of the coolant to said electronic circuit unit when leakage of the coolant is detected by said coolant leakage detecting means.

10. An electronic apparatus according to claim 7 wherein said coolant leakage detecting means has coolant decreasing rate detecting means for detecting a decreasing rate of the coolant to be fed to said objects to be cooled so that leakage of the coolant may be determined when the decreasing rate of the coolant exceeds a predetermined value.

11. An electronic apparatus according to claim 1, wherein a frame is provided which is fixedly mounted with said coolant cooling unit, said coolant cooling unit further including coolant leakage detecting means, coolant leakage alarm means for signaling detection of a leak by said leakage detection means and coolant feed stopping means, said frame including said partition plate at one side thereof, and said partition plate having joint means mounted thereon for connecting coolant pipes on the side of said objects to be cooled and coolant pipes on the side of said coolant cooling unit.

12. An electronic apparatus according to claim 1 further comprising a piping path for passing the coolant through said cooling jackets, coolant tube with fins and pump, and a coolant drainage drain provided at the bottom of a U-shaped portion of said piping path.

13. An electronic apparatus according to claim 1 further comprising a nipple mounted on said partition plate and coupling respective coolant pipes of said electronic circuit unit and said coolant cooling unit.

14. An electronic apparatus according to claim 13, wherein another nipple is mounted on said partition plate so that another coolant pipe of said electronic circuit unit is coupled with another coolant pipe of said coolant cooling unit.

15. An electronic apparatus according to claim 13, wherein said nipple has a first part on the side of the partition plate toward said coolant cooling unit and a second part on the side of the partition plate toward said electronic circuit unit, said first and second parts being connected to respective coolant pipes for coupling said coolant pipes.

16. An electronic apparatus according to claim 15, wherein the first and second parts of the nipple project from respective sides of the partition plate.

17. An electronic apparatus comprising:
an electronic circuit unit including heat-generating electronic parts, and cooling jackets fed with a coolant from a coolant pipe so as to cool said heat-generating electronic parts;
a coolant cooling unit including a coolant tube with fins through which said coolant passes for cooling the coolant from said cooling jackets, a cooling fan for blowing air to said coolant tube with fins, a tank disposed in a coolant flow path for absorbing a change in volume of said coolant due to thermal expansion and contraction, and a pump for feeding the cooled coolant to said cooling jackets by way of a coolant pipe of said cooling unit;
a partition plate;
said electronic circuit unit and said coolant cooling unit being housed side by side in the same cabinet on respective sides of said partition plate which partitions the electronic circuit unit and the coolant cooling unit, said partition plate extending from the bottom to the top of said cabinet, whereby the electronic circuit unit it not located beneath the coolant tube with fins and the tank of the coolant cooling unit so that coolant leaked and dropped from the coolant tube with fins and/or the tank does not contaminate the electronic circuit unit, said cabinet having apertures therein for ingress and egress of air to said coolant cooling unit; and
wherein said apertures includes apertures in a bottom of said cabinet, dam means being provided about the apertures in the bottom for preventing outflow of leaked coolant therethrough to the outside of the cabinet.

18. An electronic apparatus according to claim 17, wherein plate means cover said apertures in the bottom with clearance to prevent coolant droplets from above going out of the cabinet directly through the apertures.

19. A method of cooling an electronic apparatus having heat-generating electronic parts, comprising the steps of:
mounting cooling jackets to said heat-generating electronic parts of said electronic apparatus;
mounting in the same cabinet of said electronic apparatus and side by side therewith a coolant cooling unit for cooling a coolant for said electronic apparatus, and a coolant feed unit for feeding the cooled coolant to said cooling jackets, said cabinet having apertures at least in the bottom of said cabinet for ingress and egress of air from a space between the bottom of said cabinet and a floor surface;
providing a partition plate between said electronic parts and said coolant cooling unit and coolant feed unit such that said partition plate partitions the electronic parts and the cooling unit, said partition plate extending from the bottom to the top of said cabinet and said cabinet having casters movable on a floor; and
causing said coolant feed unit to feed the coolant cooled by said coolant cooling unit to said cooling jackets and causing said cooling jackets to cool said heat-generating electronic parts.

20. A method of cooling an electronic apparatus having heat-generating electronic parts according to claim 19 further comprising the step of providing a coolant drainage drain at the bottom of a U-shaped portion of a circulating path for circulating the coolant through said cooling jackets, coolant cooling unit and coolant feed unit.

* * * * *